United States Patent
Sakano et al.

(10) Patent No.: US 7,649,165 B2
(45) Date of Patent: Jan. 19, 2010

(54) IMAGE CAPTURING APPARATUS

(75) Inventors: Yorito Sakano, Chigasaki (JP); Sanae Nishida, Suwa (JP); Kazunobu Kuwazawa, Sakata (JP); Tetsuo Tatsuda, Ina (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/052,958

(22) Filed: Mar. 21, 2008

(65) Prior Publication Data

US 2009/0014628 A1    Jan. 15, 2009

(30) Foreign Application Priority Data

Mar. 23, 2007   (JP) ............... 2007-076105
Mar. 23, 2007   (JP) ............... 2007-076106

(51) Int. Cl.
*H01L 27/146*   (2006.01)
*H04N 5/335*   (2006.01)

(52) U.S. Cl. ............ 250/208.1; 257/292; 348/308

(58) Field of Classification Search ........... 250/208.1, 250/214.1; 257/194, 187, 192, 215, 290, 257/291, 292, 461, 462, E31.032; 348/308
See application file for complete search history.

(56) References Cited

U.S. PATENT DOCUMENTS

| | | | |
|---|---|---|---|
| 7,271,462 B2* | 9/2007 | Satoru | 257/462 |
| 2005/0156264 A1* | 7/2005 | Sakano et al. | 257/432 |
| 2005/0194655 A1* | 9/2005 | Sakano et al. | 257/462 |
| 2005/0247941 A1* | 11/2005 | Adachi | 257/72 |
| 2008/0290382 A1* | 11/2008 | Hirota | 257/291 |
| 2009/0014628 A1* | 1/2009 | Sakano et al. | 250/208.1 |

FOREIGN PATENT DOCUMENTS

| | | |
|---|---|---|
| JP | 3313683 | 5/2002 |
| JP | 2005-197350 | 7/2005 |
| JP | 2005-197351 | 7/2005 |
| JP | 2005-197352 | 7/2005 |
| JP | 2005-197353 | 7/2005 |
| JP | 3720014 | 9/2005 |
| JP | 2005-322731 | 11/2005 |
| JP | 2006-190740 | 7/2006 |

* cited by examiner

*Primary Examiner*—John R Lee
(74) *Attorney, Agent, or Firm*—Harness, Dickey & Pierce, P.L.C.

(57) ABSTRACT

An apparatus including: a photodiode including: a first conductivity substrate; a second conductivity PD-well on the substrate's first surface side; and a first conductivity collection well inside the PD-well; a modulation transistor including: a second conductivity TR-well connected with the PD-well, and a junction depth shallower than that of the PD-well; a first conductivity modulation well inside the TR-well, and connected with the collection well; a second conductivity source inside the modulation well, and including a region contacting the first surface; a gate electrode in a region partially covering the modulation well and enclosing the source; a gate insulation layer between the gate and the first surface; and a second conductivity drain partially sandwiching the gate and opposing the source, and including a region contacting the first surface; and a transfer transistor connected to modulation transistors in pixels between the source and a connected source line.

5 Claims, 7 Drawing Sheets

IMAGE CAPTURING APPARATUS

BACKGROUND

1. Technical Field

The present invention relates to an image capturing apparatus.

2. Related Art

An image capturing substrate configured by arranging, in a matrix, pixels each including an image capturing apparatus is mounted on a mobile phone, for example. The image capturing substrate includes, as types, an image capturing substrate including an image capturing apparatus of CCD (Carrier-Coupled Device) type, and an image capturing substrate including an image capturing apparatus of a MOS type. The CCD-type image capturing substrate is of excellent image quality, and the MOS-type image capturing substrate is less in power consumption and low in process cost. In recent years, proposed is a MOS-type image capturing substrate operating in the mode of threshold voltage modulation, offering both high image quality and low power consumption. The MOS-type image capturing substrate operating in the mode of threshold voltage modulation is described in Japanese Patent No. 3313683.

The image capturing substrate derives an image output by pixels being arranged in a matrix, and by the pixels each being repeatedly in the state of clearance, storage, and reading. In the image capturing substrate described in Japanese Patent No. 3313683, the pixels each include a photodiode for use of storage and a transistor for use of reading (hereinafter, referred to as modulation because it is an operation of indicating an operation of extracting any threshold modulation component by a light-generating carrier).

FIG. 8 is a diagram showing the schematic wiring of an image capturing substrate 100 described in Japanese Patent No. 3313683 in which pixels 3 each including a VMIS-type image capturing apparatus 120 being a combination of a photodiode PD and a modulation transistor TM are arranged in a matrix (it is used also as an equivalent circuit diagram indicating the state in which an intense light SL enters into the configuration not including a transfer transistor TS that will be described later). An output from a source section 7 of each of the pixels 3 arranged in the same row is extracted via a source line 66 of shared use. Among the pixels 3 connected to the same source line 66, supplying an ON signal to any one gate line 67 enables reading of only a signal from the source section 7 of any one of the pixels 3 connected to the gate line 67 provided with the ON signal. In this case, the selection of such a pixel 3 is made by applying a potential higher than that of a not-selected ring gate electrode 6a of a not-selected modulation transistor TMa of a not-selected pixel 3a to a ring gate electrode 6 of the modulation transistor TM of the (selected) pixel 3 for reading.

As an ON signal, the output from the source section 7 of the modulation transistor TM applied with a high gate potential will be higher than an output from a not-selected source section 7a of the not-selected modulation transistor TMa applied with a low gate potential. The output from the source section 7 of the selected pixel 3 corresponding to the gate line 67 selected by the ON signal can be derived from a source line 66x.

Herein, as the procedure for signal extraction in FIG. 8, attention is given to the source line 66x. Extracted is a difference, in terms of potential, between the source line 66x that is under the control of the potential coming from the source section 7 of the pixel 3 selected after the storage of light-generating carriers and the source line 66x that is under the control of the potential being an output of the source section 7 of the pixel 3 after the clearance. By extracting such a difference between the potential of the source line 66x after the storage and the potential of the source line 66x after the clearance, any variations among the pixels 3 caused by the characteristics distribution such as threshold value can be cancelled out, thereby being able to extract an image signal with a higher SN ratio.

For such a difference extraction, with the configuration described in Japanese Patent No. 3313683, the gate line 67 selected as shown in FIG. 8 is used for a selection of the pixel 3, and the potential from the source section 7 of the selected pixel 3 is transferred to each of the source lines 66 so that the potential from the source section 7 of the selected pixel 3 is detected. Herein, when an intense light SL enters into a not-selected photodiode PDa of the not-selected pixel 3a leading to the source line 66x, there may be a case of generating a potential higher than the potential from the source section 7 of the selected pixel 3. The reason thereof is considered that the not-selected source section 7a of the not-selected modulation transistor TMa is increased in potential, and by shifting the source potential by application of the potential to the ring gate electrode 6, the resulting potential exceeds the source potential of the selected modulation transistor TM.

In this case, compared with the potential of the source section 7 after the clearance, the potential of the not-selected source section 7a belonging to the not-selected pixel 3a receiving the intense light SL becomes higher. That is, the potential of the source line 66x of the selected pixel 3 is reduced down only to the potential of the not-selected source section 7a of the not-selected pixel 3, being higher than the potential of the source section 7 of the pixel 3 selected after the clearance. Therefore, in this case, no difference can be derived between the potential of the source section 7 of the selected pixel 3 after the storage of the light-generating carriers being outputs from the source section 7 and the potential of the source section 7 after the clearance.

With no difference as such, provided is a difference, in terms of potential, between the source section 7 after the storage of the light-generating carriers and the not-selected source section 7a of the not-selected pixel 3a exposed with the intense light SL, and thus the light intensity seems to be reduced for output, thereby causing a phenomenon called black smear.

To prevent such black smear, as shown in Japanese Patent No. 3720014, there is a technology of forming a pixel using three transistors. However, it means the number of transistors for a pixel is increased to three, and there is thus a problem of reducing the aperture ratio and reducing the light sensitivity.

SUMMARY

An object of the present invention is to provide an image capturing apparatus that can suppress any increase of the number of transistors per pixel, and prevent any possible occurrence of black smear.

In this application, the "above" is defined as a direction of moving, via the first surface of a substrate, away from an object configuring the substrate. The "below" is defined as a direction opposite to the "above". Moreover, the "aperture ratio" is defined as a ratio between the area of a region of being able to generate light-generating carriers and the area of pixels.

An image capturing apparatus of the present invention is characterized by including: a photodiode, including: a substrate of a first conductive type; a PD well section of a second conductive type that is disposed on a side of a first surface of the substrate; and a collection well section of the first conductive type that is located inside of the PD well section; a modulation transistor, including: a TR well section of the second conductive type that is connected with the PD well section, and has a junction depth shallower than a junction depth of the PD well section; a modulation well section of the first conductive type that is connected with the collection well section, and is located inside of the TR well section; a source section that is disposed inside of the modulation well section when viewed from above, is of the second conductive type, and includes a region coming in contact with the first surface of the substrate; a gate electrode that is disposed in a region that covers at least a part of the modulation well section when viewed from above, and encloses the source section; a gate insulation layer that is disposed at a position sandwiched between the gate electrode and the first surface of the substrate; and a drain section that is disposed at least at a part of a position sandwiching the gate electrode and opposing the source section when viewed from above, is of the second conductive type, and includes a region coming in contact with the first surface of the substrate; and a transfer transistor that is connected to each a pair of two of the modulation transistors disposed in adjacent pixels between a pair of the source section and a source line being electrically connected to each other, and controls a state of conduction between the source section and the source line by a selection signal.

An image capturing apparatus of the present invention is characterized by including: a photodiode, including: a substrate of a first conductive type; a PD well section of a second conductive type that is disposed on a side of a first surface of the substrate; and a collection well section of the first conductive type that is located inside of the PD well section; a modulation transistor, including: a TR well section of the second conductive type that is connected with the PD well section, and has a junction depth shallower than a junction depth of the PD well section; a modulation well section of the first conductive type that is connected with the collection well section, and is located inside of the TR well section; a source section that is disposed inside of the modulation well section when viewed from above, is of the second conductive type, and includes a region coming in contact with the first surface of the substrate; a gate electrode that is disposed in a region that covers at least a part of the modulation well section when viewed from above, and encloses a part of the source section; an element separation layer that encloses the source section together with the gate electrode when viewed from above; a gate insulation layer that is disposed at a position sandwiched between the gate electrode and the first surface of the substrate; and a drain section that is disposed at least at a part of a position sandwiching the gate electrode and opposing the source section when viewed from above, is of the second conductive type, and includes a region coming in contact with the first surface of the substrate; and a transfer transistor that is connected to each a pair of two of the modulation transistors disposed in adjacent pixels between a pair of the source section and a source line being electrically connected to each other, and controls a state of conduction between the source section and the source line by a selection signal.

With such a configuration, the transistor to be disposed to each of the pixels will be one and a half (one transfer transistor is to be disposed with respect to two pixels of a modulation transistor in addition to the modulation transistor), thereby being able to keep high the aperture ratio.

Moreover, one transfer transistor is provided with respect to a pair of any two adjacent source sections, and a connection is established with a source line via the transfer transistor. Therefore, any black smear caused to one of the source sections restrictively spreads only to the source section of the other paired transistor. Such spreading of black smear to the source line is suppressed by the transfer transistor disposed between the source section of the other paired transistor and the source line, thereby being able to suppress spreading of black smear in the state that the aperture ratio is kept high.

Moreover, the source section is so enclosed as to be electrically independent with the combination use of a gate electrode and an element separation layer. By using together the element separation layer for making the source section electrically independent, the pattern layout can be increased in flexibility. Accordingly, for a pattern layout including the transfer transistor, the photodiode can be also increased in terms of the flexibility of shape so that the resulting layout can lead to higher light reception efficiency. It becomes thus possible to provide an image capturing element configuring a highly-sensitive image capturing apparatus.

Moreover, an image capturing apparatus of the present invention is characterized by including: a photodiode, including: a substrate of a first conductive type; a PD well section of a second conductive type that is disposed on a first surface of the substrate; and a collection well section of the first conductive type that is located inside of the PD well section; a modulation transistor, including: a TR well section of the second conductive type that is connected with the PD well section, and has a junction depth shallower than a junction depth of the PD well section; a modulation well section of the first conductive type that is connected with the collection well section, and is located inside of the TR well section; a source section that is disposed inside of the modulation well section when viewed from above, is of the second conductive type, and includes a region coming in contact with the first surface of the substrate; a gate electrode that is disposed in a region that covers a part of the modulation well section when viewed from above, and encloses the source section; a gate insulation layer that is disposed at a position sandwiched between the gate electrode and the first surface of the substrate; and a drain section that is disposed at a part of a position sandwiching the gate electrode and opposing the source section when viewed from above, is of the second conductive type, and includes a region coming in contact with the first surface of the substrate; and a transfer transistor in which a transmission TR gate source section and a transmission TR gate drain section are connected to each other between the source section and the source line of each of the modulation transistors, and by a selection signal to be applied to a transmission TR gate electrode, controls a state of conduction between the source section and the source line.

With such a configuration, the transistor to be disposed to each of the pixels will be only two, thereby being able to keep high the aperture ratio. Moreover, because the transfer transistor is disposed between the source section and the source line, even when an intense light is directed to not-selected pixels using the source line of shared use, and even when the source potential of the not-selected pixels exceeds the source potential of the selected pixels, the transfer transistor blocks the source of the not-selected pixels and the source line. Accordingly, the source potential of the not-selected pixels does not affect the potential of the source line connected to the selected pixels. It thus becomes able to provide an image capturing apparatus that can stop the occurrence of black smear.

Moreover, an image capturing apparatus of the present invention is characterized by including: a photodiode, including: a substrate of a first conductive type; a PD well section of a second conductive type that is disposed on a first surface of the substrate; and a collection well section of the first conductive type that is located inside of the PD well section; a modulation transistor, including: a TR well section of the second conductive type that is connected with the PD well section, and has a junction depth shallower than a junction depth of the PD well section; a modulation well section of the first conductive type that is connected with the collection well section, and is located inside of the TR well section; a source section that is disposed inside of the modulation well section when viewed from above, is of the second conductive type, and includes a region coming in contact with the first surface of the substrate; a gate electrode that is disposed in a region that covers at least a part of the modulation well section when viewed from above, and encloses a part of the source section; an element separation layer that encloses the source section together with the gate electrode when viewed from above; a gate insulation layer that is disposed at a position sandwiched between the gate electrode and the first surface of the substrate; and a drain section that is disposed at a part of a position sandwiching the gate electrode and opposing the source section when viewed from above, is of the second conductive type, and includes a region coming in contact with the first surface of the substrate; and a transfer transistor in which a transmission TR gate source section and a transmission TR gate drain section are connected to each other between the source section and the source line of each of the modulation transistors, and by a selection signal to be applied to a transmission TR gate electrode, controls a state of conduction between the source section and the source line.

With such a configuration, the transistor to be disposed to each of the pixels will be only two, thereby being able to keep high the aperture ratio. Moreover, because the transfer transistor is disposed between the source section and the source line, even when the source potential of the selected pixels is exceeded due to entering of an intense light to a part of not-selected pixels using the source line of shared use, the transfer transistor blocks the source of the not-selected pixels and the source line. Accordingly, any signal coming from the not-selected pixels does not affect the potential of the source line connected to the selected pixels. It thus becomes able to stop the occurrence of black smear. Moreover, the source section is so enclosed as to be electrically independent with the combination use of a gate electrode and an element separation layer. By using together the element separation layer for making the source section electrically independent, the pattern layout can be increased in flexibility. Accordingly, for a pattern layout including the transfer transistor, the photodiode can be also increased in terms of the flexibility of shape so that the resulting layout can lead to higher light reception efficiency. It becomes thus possible to provide an image capturing apparatus configuring a highly-sensitive image capturing substrate.

Further, the image capturing apparatus of the present invention is characterized in that the pixels sharing the same source line are laid out by mirror inversion in a direction of intersecting with the source line on a row basis, and the transfer transistor is disposed in a region where the modulation transistor is disposed nearby.

With such a configuration, the source is disposed in the region where the modulation transistor is disposed nearby so that the length of wiring connecting the two source sections can be suppressed. Accordingly, this enables to reduce the area of wiring so that the aperture section can be increased in size.

Still further, the electro-optic substrate of the present invention is characterized in that not only by laying out the pixels sharing the same source line by mirror inversion in a direction of intersecting with the source line on a row basis but also by laying out the pixels located at positions of sandwiching the source line by mirror inversion in a direction of aligning with the source line on a row basis, and the transfer transistor is disposed in a region where the modulation transistor is disposed nearby.

With such a configuration, the gate contact of the transfer transistor can be shared for use so that the area for the transfer transistor can be reduced to a further degree, and the aperture section can be thus increased in size to a further degree.

Moreover, the image capturing apparatus of the present invention is characterized by further including a pinning layer of the second conductive type between, in a region where the photodiode is located, a surface of the substrate and the collection well section including the surface of the substrate, and/or between the gate insulation layer and the modulation well including an interface between the gate insulation layer and the substrate.

With this configuration, a pinning layer of the second conductive type is used to fill the center of generation/re-coupling found more on the substrate surface than inside of the substrate, thereby suppressing the generation of carrier causing a noise, and being able to provide an image capturing apparatus configuring an image capturing substrate of higher image quality.

Moreover, the image capturing apparatus of the present invention is characterized by further including a carrier pocket section showing an impurity concentration of the first conductive type higher than that of the modulation well section therearound in a region of the modulation well section with at least a partial overlay of the gate electrode when viewed from above.

With this configuration, a carrier pocket showing the impurity concentration of a first conductive type higher than that of the modulation well section therearound is formed in a region with at least a partial overlay of the gate electrode when viewed from above. When the modulation well section of the modulation transistor is depleted using this configuration, in the region with the high impurity concentration, the function is provided for inducing the light-generating carriers with any formed potential well of a larger size. As a result, the light-generating carriers generated by the photodiode are collected with efficiency into the carrier pocket of the modulation transistor, thereby being able to provide an image capturing element configuring the image capturing apparatus with higher image quality especially when the light intensity is low.

DESCRIPTION OF EXEMPLARY
EMBODIMENTS

In the below, by referring to the accompanying drawings, an embodiment of the present invention is described in detail. As the description procedure, described first is the basic configuration of a VMIS image capturing element of a ring gate electrode configuration (including a source section enclosed by a gate electrode). Described next is the basic configuration of a substrate-modulation MOS (including a source section enclosed by a gate electrode and an element separation layer) image capturing element. Thereafter, the reason of the occurrence of black smear is described, and then the operation of an image capturing apparatus provided with a transfer transistor for suppressing the occurrence of this black smear. Herein, described is the example of applying the NMOS configuration to VMIS and substrate-modulation MOS image capturing elements. In this example, as an alternative to the NMOS configuration, the PMOS configuration is also an option, and if this is the case, reversing the polarity of the impurity and the polarity of the driving potential will lead to the similar operation.

<Basic Configuration of VMIS Image Capturing Element>

Figure 1A:
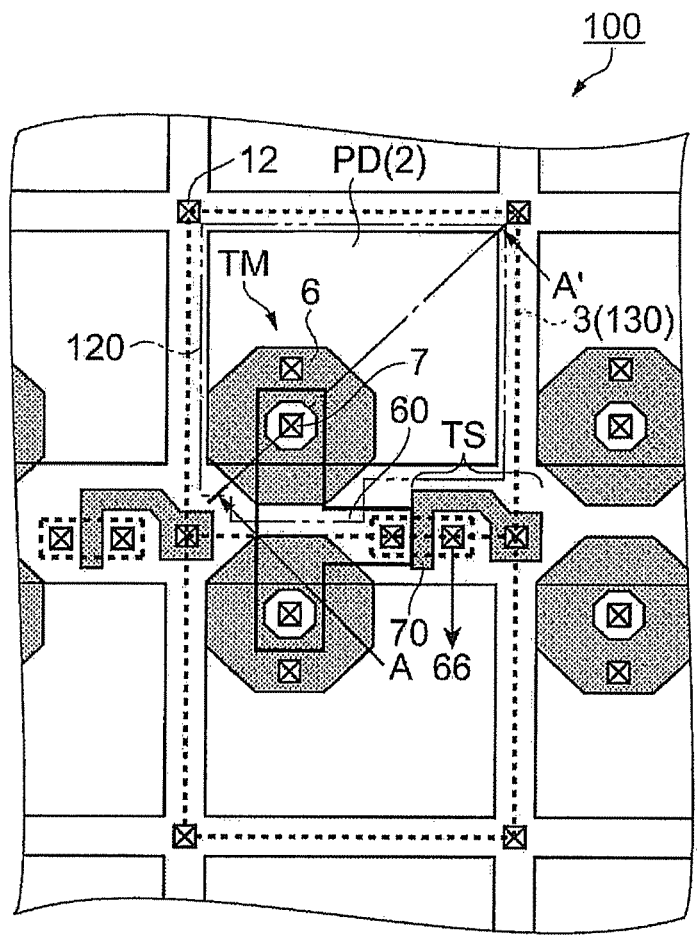
FIG. 1A is a partial plan view of an image capturing substrate on which pixels including VMIS image capturing elements are arranged in an array.
Figure 1B:
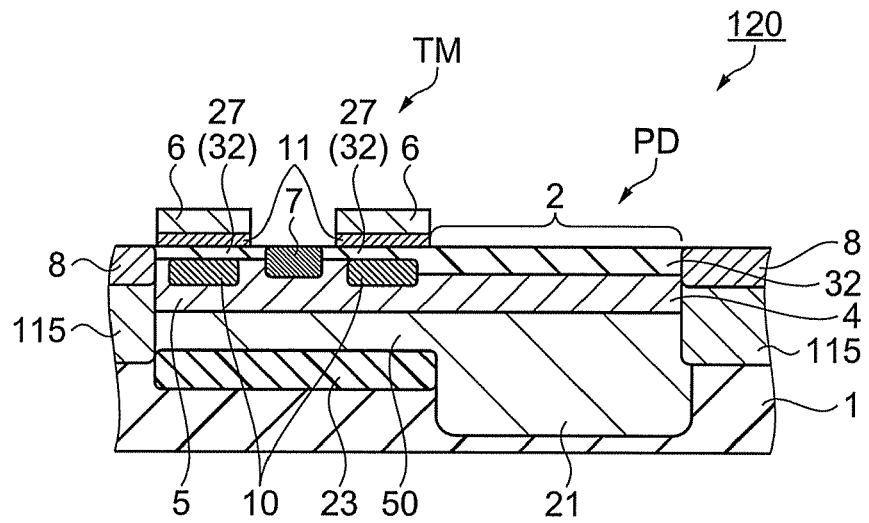
FIG. 1B is a cross sectional view of the VMIS image capturing element cut across a line A-A' of FIG. 1A.

In the below, by referring to FIGS. 1A and 1B, described is the basic configuration of a VMIS image capturing element. FIG. 1A is a partial plan view of an image capturing substrate 100 on which pixels 3 including VMIS image capturing elements 120 are arranged in an array. FIG. 1B is a cross sectional diagram showing the cross sectional configuration of the VMIS image capturing element 120 cut across a line A-A' of FIG. 1A. In the below, by referring to FIGS. 1A and 1B, described is the basic configuration of the VMIS image capturing element.

As shown in FIG. 1A, in the pixel 3, a photodiode PD and a modulation transistor TM are disposed adjacent to each other. The modulation transistor TM is exemplified by a MOS transistor of N-channel-depression type. The pixel 3 also carries therein the VMIS image capturing element 120 and a transfer transistor TS. The transfer transistor TS can be of a PMOS configuration. The function of the transfer transistor TS will be described later. Note here that a metal wiring 60 of FIG. 1A is not shown in the cross sectional diagram of FIG. 1B for simplicity.

In the region of the photodiode PD being a photoelectric conversion element, an aperture region 2 is disposed on the surface of a substrate 1, and at a relatively shallow position in the surface of the substrate 1, a collection well section 4 is disposed for collecting light-generating carriers generated by the photoelectric conversion element. Between the collection well section 4 and the surface of the substrate 1, an N-type diffusion layer is disposed as a pinning layer 32.

The modulation well section 5 is disposed adjacent to the collection well section 4. The light-generating carriers stored in the collection well section 4 are transferred to the modulation well section 5 located in the region of the modulation transistor TM. By the light-generating carriers stored in the modulation well section 5 as such, the modulation transistor TM shows a change of threshold value, and the threshold value of the modulation transistor TM takes a value corresponding to the amount of the stored light-generating carriers (amount of light entered into the region of the photodiode PD).

On the modulation well section 5, a ring gate electrode 6 being a ring-shaped gate electrode is disposed on the surface of the substrate 1 via a gate insulation layer 11. In the vicinity of the surface of the substrate 1 covered by the gate insulation layer 11, an N-type diffusion layer 27 configuring a channel is disposed. At the same time, the N-type diffusion layer 27 serves also as the pinning layer 32. The N-type diffusion layer 27 configuring a channel is connected to both a source section 7 and a drain section 8. The VMIS image capturing elements 120 are each separated by an N-type element separation region 115.

In the region enclosed by the ring gate electrode 6, the source section 7 being a high-concentration N-type region is disposed. In such a manner as to cover at least a part of the ring gate electrode 6, the N-type drain section 8 is disposed. At the predetermined position of the drain section 8, a drain contact region 12 being a high-concentration N-type region is disposed.

The modulation well section 5 is the one for controlling the threshold voltage of the modulation transistor TM. Inside of the modulation well section 5, a carrier pocket 10 configuring a P-type high-concentration region is disposed below the ring gate electrode 6. The modulation transistor TM is configured to include the modulation well section 5, the carrier pocket 10, the ring gate electrode 6, the source section 7, and the drain section 8. The threshold voltage of the channel is then changed depending on the light-generating carriers stored in the modulation well section 5 (the carrier pocket 10).

By the drain section 8 and the pinning layer 32 being biased to the positive potential by the application of a drain potential, below an aperture region 2 of the photodiode PD, a depletion layer extends from the border surface between the pinning layer 32 and the collection well section 4 to the collection well section 4 in its entirety, thereby reaching a PD well section 21. On the other hand, another depletion layer extends from the boarder surface between the substrate 1 and the PD well section 21 to the PD well section 21 in its entirety, thereby reaching the collection well section 4. In such depletion layers, light-generating carriers are generated by the light entered via the aperture region 2. Thereafter, as described above, the light-generating carriers generated as such are collected in the collection well section 4. The light-generating carriers collected in the collection well section are transferred to the modulation well section 5 for storage in the carrier pocket 10. As such, the source potential of the modulation transistor TM is related to the amount of the light-generating carriers transferred to the modulation well section 5, i.e., the light entering the photodiode PD.

The PD well section 21 is disposed at a relatively deep position in the substrate 1. Inside of the PD well section 21, the P-type collection well section 4 is disposed. The PD well section 21 is so disposed as to reach a relatively deep position in the substrate 1, thereby being able to subjecting, to photoelectric conversion, long-wavelength lights whose entering depth in the substrate 1 is deep (for example, red).

On the other hand, in the region of the modulation transistor TM, a P-type embedding layer 23 is disposed. By the p-type embedding layer 23, the depth of the TR well section 50 is restricted to a relatively shallow position in the substrate 1. Because the TR well section 50 is formed at a relatively shallow position, the electric field strength in the modulation well section 5 can be increased when any potential is applied to the ring gate electrode 6, and by applying the potential to the ring gate electrode 6 as such, the light-generating carriers stored inside of the modulation well section 5 can be emitted to the substrate 1.

Herein, as the basic configuration of the VMIS image capturing element 120, the pinning layer 32 is not necessarily provided. The carrier pocket 10 is not also necessarily provided. When the carrier pocket 10 is not provided, the electric charge is stored in the modulation well section 5, and by this electric charge, the threshold voltage is controlled. By not providing the pinning layer 32 and/or the carrier pocket 10, the manufacturing process can be shortened. Especially for an application of handling an object with the relatively high illumination, the image noise does not cause that much of a problem. By not providing such components, it becomes possible to provide the VMIS image capturing element 120 with which TAT is shortened by the reduction of the manufacturing process, the failure ratio is reduced, and the cost is reduced.

<Basic Configuration of Substrate-Modulation MOS Image Capturing Element>

Figure 2A:
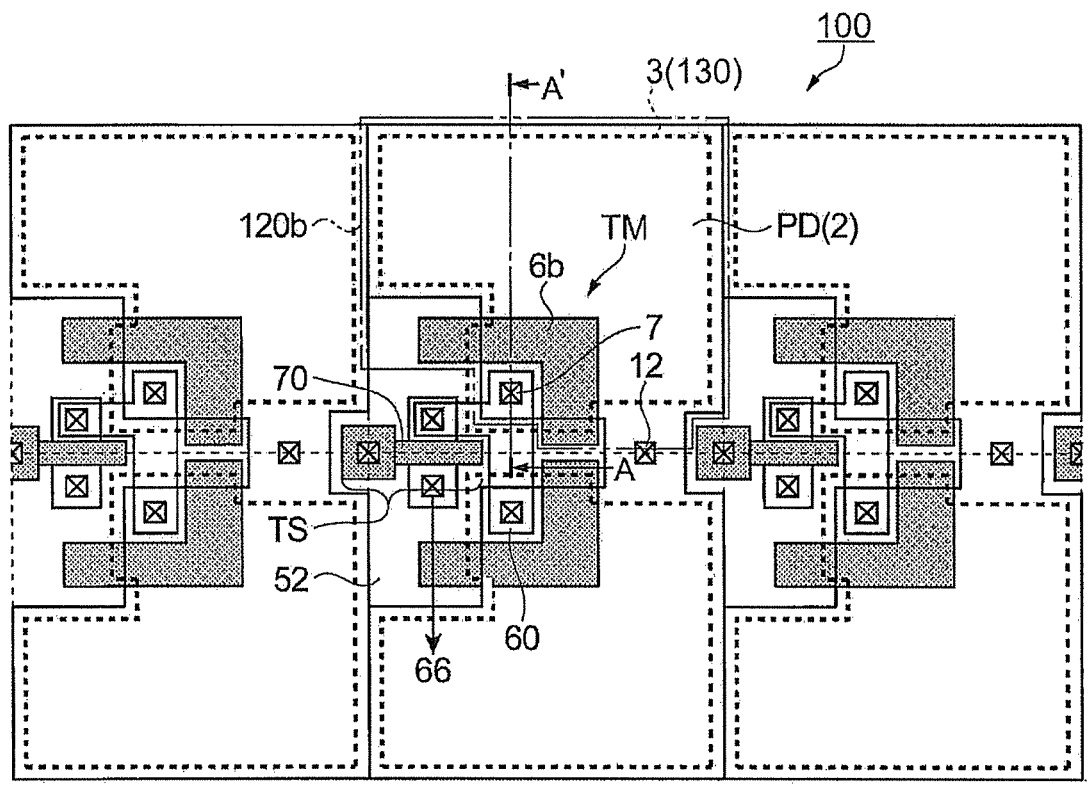
FIG. 2A is a partial plan view of an image capturing substrate on which pixels including substrate-modulation MOS image capturing elements are arranged in an array.
Figure 2B:
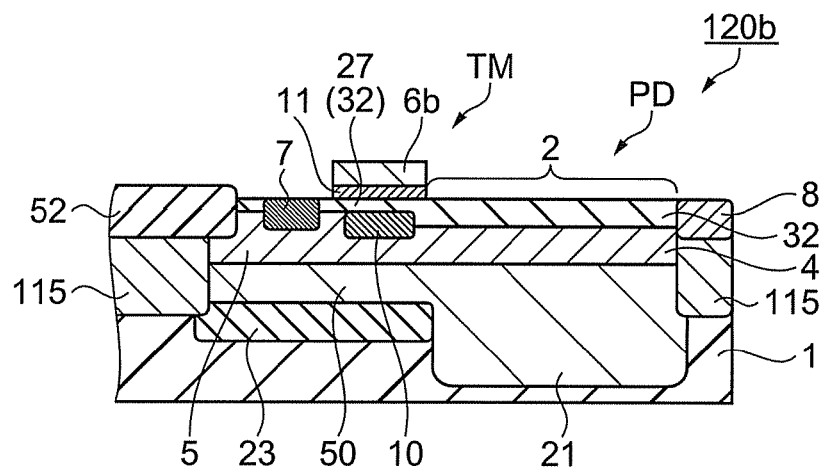
FIG. 2B is a cross sectional view of the substrate-modulation MOS image capturing element cut across a line A-A' of FIG. 2A.

In the below, by referring to FIGS. 2A and 1B, described is the basic configuration of a substrate-modulation MOS image capturing element. FIG. 2A is a partial plan view of the image capturing substrate 100 on which the pixels 3 including substrate-modulation MOS image capturing elements 120b are arranged in an array. FIG. 2B is a cross sectional diagram showing the cross sectional configuration of the substrate-modulation MOS image capturing element 120b cut across a line A-A' of FIG. 2A. In the below, by referring to FIGS. 2A and 1B, described is the basic configuration of the substrate-modulation MOS image capturing element.

As shown in FIG. 2A, inside of the pixel 3, a photodiode PD and a modulation transistor TM are disposed adjacent to each other. The modulation transistor TM is exemplified by a MOS transistor of N-channel-depression type. The pixel 3 also carries therein the substrate-modulation MOS image capturing element 120b and a transfer transistor TS. The transfer transistor TS can be of a PMOS configuration. The function of the transfer transistor TS will be described later. Note here that the metal wiring 60 of FIG. 2A is not shown in the cross sectional diagram of FIG. 2B for simplicity.

In the region of the photodiode PD being a photoelectric conversion element, the aperture region 2 is disposed on the surface of the substrate 1, and at a relatively shallow position in the surface of the substrate 1, the collection well section 4 is disposed for collecting light-generating carriers generated by the photoelectric conversion element. Between the collection well section 4 and the surface of the substrate 1, an N-type diffusion layer is disposed as the pinning layer 32.

The modulation well section 5 is disposed adjacent to the collection well section 4. The light-generating carriers stored in the collection well section 4 are transferred to the modulation well section 5 located in the region of the modulation transistor TM. By the light-generating carriers stored in the modulation well section 5 as such, the threshold value of the modulation transistor TM is controlled, and the threshold value of the modulation transistor TM takes a value corresponding to the amount of the stored light-generating carriers (amount of light entered in the region of the photodiode PD).

On the modulation well section 5, an L-shaped gate electrode 6b is disposed via the gate insulation layer 11 on the surface side of the substrate 1, and in the region enclosed by the gate electrode 6b and an element separation layer 52 of LOCOS, the source section 7 being a high-concentration N-type region is disposed. Herein, the element separation layer 52 is not restrictive to the LOCOS, and may be of an STI configuration.

In the vicinity of the surface of the substrate 1 covered by the gate insulation layer 11, the N-type diffusion layer 27 configuring a channel is disposed. At the same time, the N-type diffusion layer 27 serves also as the pinning layer 32. The N-type diffusion layer 27 configuring a channel is connected to both the source section 7 and the drain section 8. The substrate-modulation MOS image capturing elements 120b are each separated by the N-type element separation region 115, and the element separation layer 52.

At the position opposing the source section 7 via the gate electrode 6b, the N-type drain section 8 is disposed. At the predetermined position of the drain section 8, the drain contact region 12 being a high-concentration N-type region is disposed.

The modulation well section 5 is the one for controlling the threshold voltage of the modulation transistor TM. Inside of the modulation well section 5, the carrier pocket 10 configuring the P-type high-concentration region is disposed below the gate electrode 6b. The modulation transistor TM is configured to include the modulation well section 5, the carrier pocket 10, the element separation layer 52, the gate electrode 6b, the source section 7, and the drain section 8. The threshold voltage of the channel is changed depending on the light-generating carriers stored in the modulation well section 5 (the carrier pocket 10).

By the drain section 8 and the pinning layer 32 being biased to the positive potential by the application of a drain potential, below the aperture region 2 of the photodiode PD, a depletion layer extends from the border surface between the pinning layer 32 and the collection well section 4 to the collection well section 4 in its entirety, thereby reaching the PD well section 21. On the other hand, another depletion layer extends from the boarder surface between the substrate 1 and the PD well section 21 to the PD well section 21 in its entirety, thereby reaching the collection well section 4. In such depletion layers, light-generating carriers are generated by the light entered via the aperture region 2. Thereafter, as described above, the light-generating carriers generated as such are collected in the collection well section 4. The light-generating carriers collected in the collection well section are transferred to the modulation well section 5 for storage in the carrier pocket 10. As such, the source potential of the modulation transistor TM is related to the amount of the light-generating carriers transferred to the modulation well section 5, i.e., the light entering the photodiode PD.

The PD well section 21 is disposed at a relatively deep position in the substrate 1. On the PD well section 21, the P-type collection well section 4 is disposed. On the surface side of the substrate on the collection well section 4, the pinning layer 32 including the N-type diffusion layer is disposed. The PD well section 21 is so disposed as to reach a relatively deep position in the substrate 1, thereby being able to subjecting, to photoelectric conversion, long-wavelength lights (e.g., color of red) whose entering depth in the substrate 1 is deep.

On the other hand, in the region of the modulation transistor TM, the P-type embedding layer 23 is disposed. By the p-type embedding layer 23, the TR well section 50 is restricted to a relatively shallow position in the substrate 1. Because the TR well section 50 is formed at a relatively shallow position, the electric field strength in the modulation well section 5 can be increased when any potential is applied to the gate electrode 6b, and by applying the potential to the gate electrode 6b as such, the light-generating carriers stored inside of the modulation well section 5 can be emitted to the substrate 1.

Herein, as the basic configuration of the substrate-modulation MOS image capturing element 120b, the pinning layer 32 is not necessarily provided. The carrier pocket 10 is not also necessarily provided. When the carrier pocket 10 is not provided, the electric charge is stored in the modulation well section 5, and by this electric charge, the threshold voltage is controlled. By not providing the pinning layer 32 and/or the carrier pocket 10, the manufacturing process can be shortened. Especially for an application of handling an object with the relatively high illumination, the image noise does not cause that much of a problem. By not providing such components, it becomes possible to provide the substrate-modulation MOS image capturing element with which TAT is shortened by the reduction of the manufacturing process, the failure ratio is reduced, and the cost is reduced.

<Configuration of Image Capturing Apparatus>

Described next is the configuration of an image capturing apparatus of the embodiment by referring to FIGS. 1A and B. Although the description here is given for a case where a VMIS image capturing element is used, when a substrate-modulation MOS image capturing element is used, replacing the VMIS image capturing element with the substrate-modulation MOS image capturing element will do. For the plane layout diagram when the substrate-modulation MOS image capturing element is in use, the configuration of FIG. 2A can be used.

The image capturing substrate 100 is so configured that the pixels 3 including the VMIS image capturing elements 120 are arranged in a matrix. The image capturing substrate 100 includes the pixels 3 of 640 by 480, and a region for optical black (OB) (OB region). With such an OB region, the image capturing substrate 100 includes the pixels 3 of 712 by 500.

An image capturing apparatus 130 is disposed inside of the pixel 3, and includes a photodiode PD in charge of photoelectric conversion, a modulation transistor TM for detecting optical signals for reading, and a transfer transistor TS. The photodiode PD generates light-generating carriers in accordance with an incoming light, and collects the carriers in the collection well section 4. The light-generating carriers collected in the collection well section 4 as such are transferred to the carrier pocket 10 inside of the modulation well section 5 provided for threshold modulation of the modulation transistor TM.

By the light-generating carriers being stored in the carrier pocket 10 as such, the modulation transistor TM shows a change of back gate potential, and the modulation transistor TM shows a change of threshold voltage corresponding to the amount of the light-generating carriers in the carrier pocket 10. As a result, the source potential of the modulation transistor TM becomes related to the light-generating carriers in the carrier pocket 10, i.e., becomes related to the amount of lights entering the photodiode PD.

Figure 3:
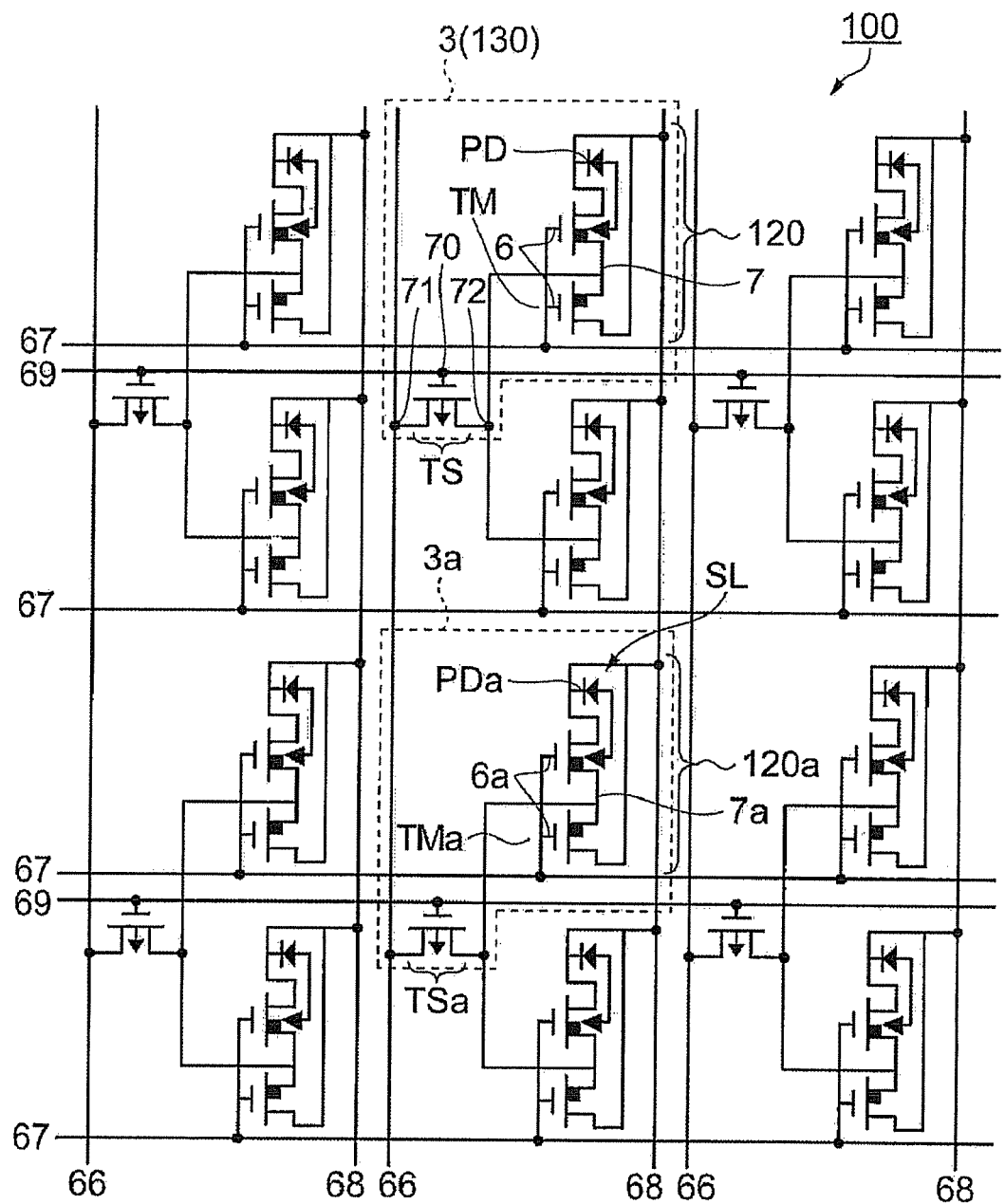
FIG. 3 is an equivalent circuit diagram of the image capturing substrate of FIG. 1A.

The transfer transistor TS includes a transmission TR gate electrode 70, a transmission TR source section 71, and a transmission TR drain section 72 (refer to FIG. 3). Through control over the gate potential of the transmission TR gate electrode 70, the conduction/interruption of the transmission TR source section 71 and that of the transmission TR drain section 72 can be controlled. Accordingly, this enables control over the connection state between the source section 7 of the modulation transistor TM to be connected with the transmission TR drain section 72 and the source line 66 to be connected with the transmission TR source section 71.

As such, inside of the pixel 3, a drive signal is applied to the transmission TR gate electrode 70 of the transfer transistor TS, the ring gate electrode 6 of the modulation transistor TM, the source section 7, and the drain section 8, thereby performing operations such as storage, transfer, modulation, and clearance.

Next, by referring to FIG. 3, described are the mechanism of causing black smear and the mechanism of preventing the occurrence thereof. FIG. 3 is an equivalent circuit diagram of the image capturing substrate 100 of FIG. 1. Herein, for convenience, in addition to the positional relationship of FIG. 3, the directions of horizontal, vertical, and others are shown.

The pixel 3 carrying therein the image capturing apparatus 130 including the VMIS image capturing element 120 and the transfer transistor TS is provided at a position corresponding to each of intersections between a plurality of source lines 66 arranged in the vertical direction and a plurality of gate lines 67 arranged in the horizontal direction. The ring gate electrodes 6 of the modulation transistors TM included in the pixels 3 arranged in the horizontal direction are respectively connected to the gate lines 67. The drain line 68 of shared use is disposed in the vertical direction, and is so arranged as to achieve entirely the same potential for the potential of the drain section 8 (refer to FIG. 1B) included in the pixels 3 arranged in a matrix. The source sections 7 of the modulation transistors TM included in the pixels 3 are respectively connected to the source lines 66 via the transmission TR gate electrodes 70 of the transfer transistors TS. In this case, the modulation transistors TM are operating in a source follower. Herein, the transfer transistors TS are each of a PMOS configuration, and the transistors TR are turned on by reducing the potential of the transmission TR gate lines 69.

By supplying an ON signal to any one of the gate lines 67, and by supplying an ON signal (low-potential signal due to the PMOS configuration) to the transmission TR gate line 69 of the transfer transistor TS, the pixels 3 connected to the gate line 67 provided with the ON signal are all selected at the same time. From each of the source sections 7 of the pixels 3 selected as such, a pixel signal is output via the transfer transistor TS. By supplying an ON signal to the gate line 67 with sequential shifting, the pixel signals from the pixels 3 provided with the ON signal are read from the source line 66 for a line of the gate line 67 all at once.

For preventing any variations of the pixels 3 and for removing various types of noise, in the reading operation, after the reading operation of an optical signal from any selected line, the pixels 3 of the selected line are cleared with the state of potential provision remained the same for the pixels 3 of not-selected lines. Thereafter, the threshold voltage in the state of clearance is read. Then a calculation is made for a differential signal between the threshold voltage corresponding to the amount of the light-generating carriers and the threshold voltage in the state of clearance, and the result is output as a video signal, thereby cancelling out any possible variations or others resulted from the distribution of the threshold values of the pixels 3. With such a process, extraction of the image signal with a high SN ratio is enabled.

Figure 4:
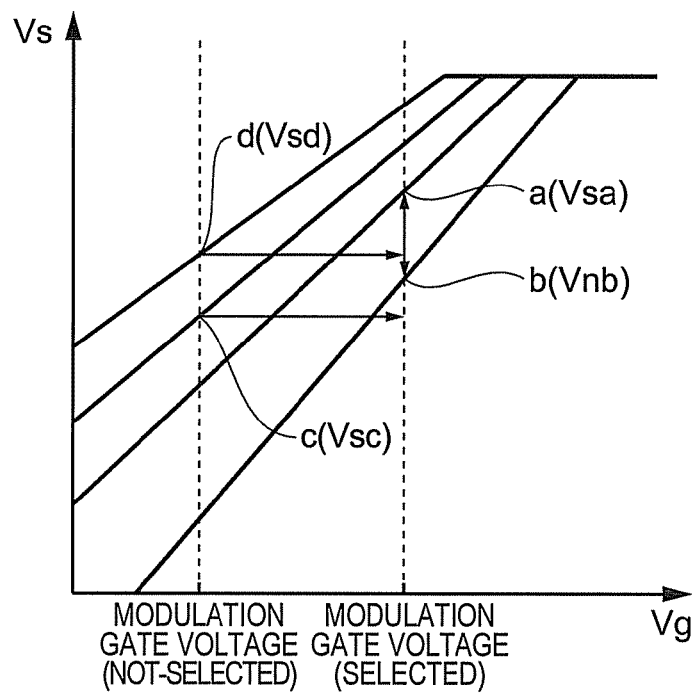
FIG. 4 is a graph showing the output potential in accordance with the light intensity.

FIG. 4 is a graph showing the output potential in accordance with the light intensity. The points a and b indicate the output potential of the pixels 3 (refer to FIG. 3: the same is applicable to below) of the selected line respectively receiving the incoming light of the general amount, and the output potentials Vsa and Vnb of the pixels 3 of the noise component after the clearance. The point c indicates the output potential Vsc based on the not-selected pixel 3a receiving the incoming light of general amount. The point d indicates the output potential Vsd based on the not-selected pixel 3a when an intense light SL is provided. When the pixels 3 of the selected line receive an incoming light of general amount, as a pixel signal of the pixels 3 of the selected line, the resulting signal has the potential difference of (Vsa−Vnb) (in the range of an arrow). As described in the foregoing, when the light of general intensity is directed to the pixels 3 of the not-selected line, the output potential Vsc at the point c becomes lower than the output potential Vnb at the point b, thereby not affecting the operation of the selected line.

Herein, described is the mechanism of causing black smear when no transfer transistor TS is used. First of all, for a predetermined row, an incoming light of general amount is directed to the pixels 3 of the selected line, and when an intense light SL is directed to any one of the not-selected pixels 3a, the output potential Vsa is output in the state before the clearance based on the pixels 3 of the selected line. On the other hand, the output potential Vnb after the clearance of the selected line becomes lower than the output potential Vsd based on the not-selected pixel 3a with the intense light SL being directed thereto. Because the source section is connected for shared use in the same row, for modulation (reading) after the clearance, the higher output potential Vsd is derived as a pixel signal after the clearance. Therefore, as a pixel signal of the pixels 3 of the selected line, a signal of (Vsa−Vsd) is output. (Vsa−Vsd) is small in value compared with (Vsa−Vnb), and display based on this pixel signal output will be in black.

Figure 8:
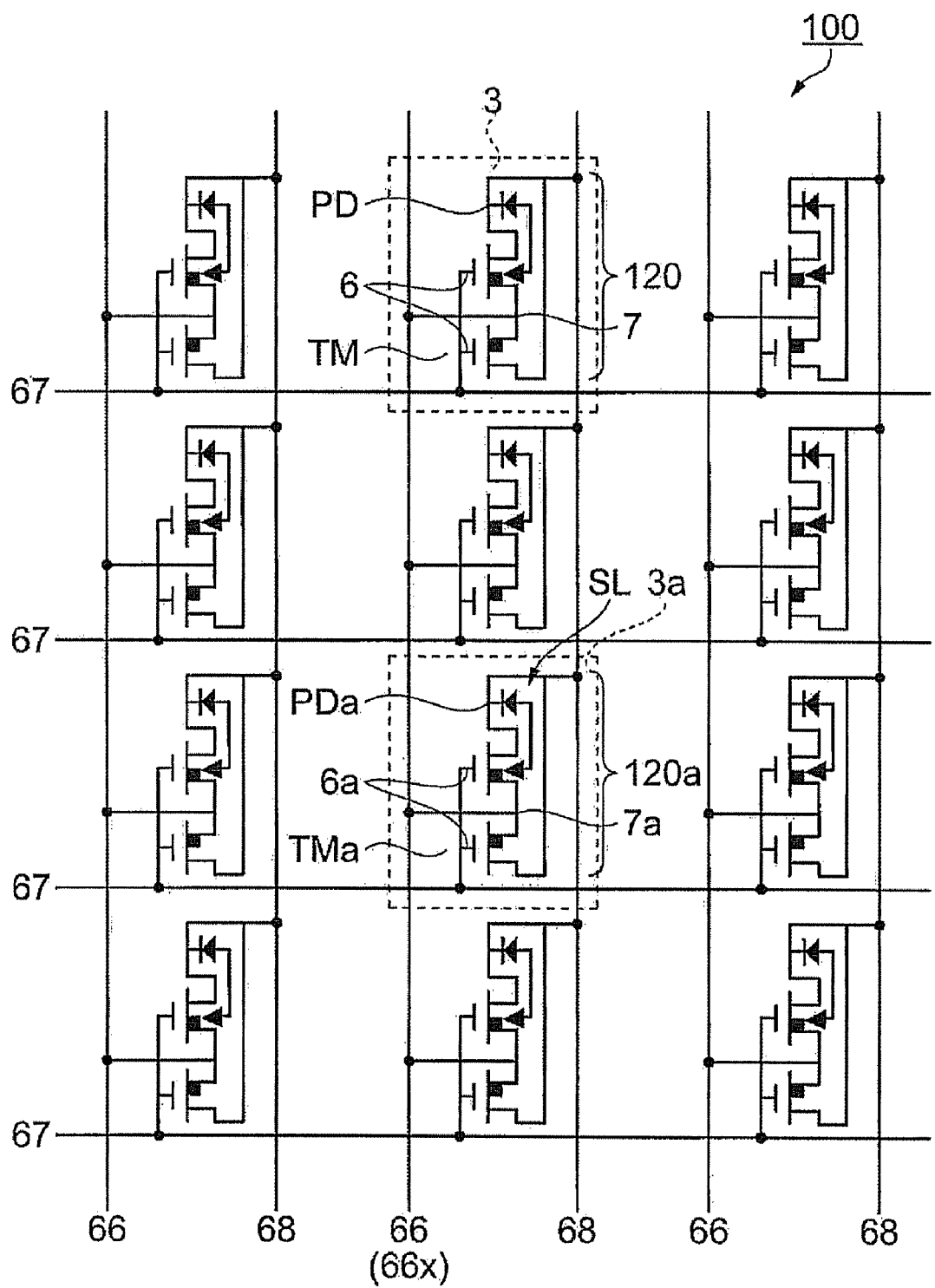
FIG. 8 is an equivalent circuit diagram showing the state when an intense light is directed into the configuration not using a transfer transistor.

FIG. 8 is an equivalent circuit diagram showing the state when an intense light SL is directed into the configuration using no transfer transistor TS. When an intense light is directed to the not-selected pixel 3a, until the not-selected pixel 3a is cleared, every differential signal from the pixels 3 connected to the source line 66x takes a value of (Vsa−Vsd), which is small in value compared with the original (Vsa−Vnb), thereby causing black smear in the vertical direction on the screen display.

On the other hand, in this embodiment, as shown in FIG. 3, in the source section 7 of the modulation transistor TM, only the potential of the source sections 7 of the two modulation transistors TM selected by the transfer transistor TS is transmitted to the source line 66. Therefore, even when an intense light SL is directed to a not-selected photodiode PDa, and even when an output signal from the not-selected source section 7a of the not-selected modulation transistor TMa becomes higher than that of the source section 7 of the selected modulation transistor TM after the clearance, the not-selected transfer transistor TSa can prevent transmission to the source line 66x. As such, any possible black smear affecting the entire screen can be prevented from occurring.

<Exemplary Layout>

FIG. 1A shows an exemplary layout when a VMIS image capturing element is used. In this layout, the pixels 3 sharing the same source line 66 are laid out by mirror inversion in a direction of intersecting with the source line 66 (orthogonal in this example) on a row basis. The source sections 7 of the modulation transistors TM brought closer as a result of mirror inversion are connected together by the metal wiring 60 including aluminum. The metal wiring 60 as a result of connection and the source line 66 are connected together via the transfer transistor TS. This thus enables to place the metal wiring 60 not on the aperture section of the photodiode PD, thereby being able to place the transfer transistor TS while suppressing any area reduction for the aperture section of the photodiode PD.

FIG. 2A shows an exemplary layout when a substrate-modulation MOS image capturing element is used. In this layout, the pixels 3 sharing the same source line 66 are laid out by mirror inversion in a direction of intersecting with the source line 66 (orthogonal in this example) on a row basis. The source sections 7 of the two modulation transistors TM brought closer as a result of mirror inversion are connected together by the metal wiring 60 using a metal including aluminum. The metal wiring 60 as a result of connection and the source line 66 are connected together via the transfer transistor TS. Similarly to this layout example, this thus allows placement with suppression of any area reduction for the aperture section of the photodiode PD. Moreover, the source section 7 and the drain section 8 are separated from each other using the gate electrode 6b and the element separation layer 52, the layout is increased in flexibility, and compared with a case of separating the source section 7 and the drain section 8 using the ring gate electrode 6 of FIG. 1, the resulting aperture ratio can be higher.

Figure 7:
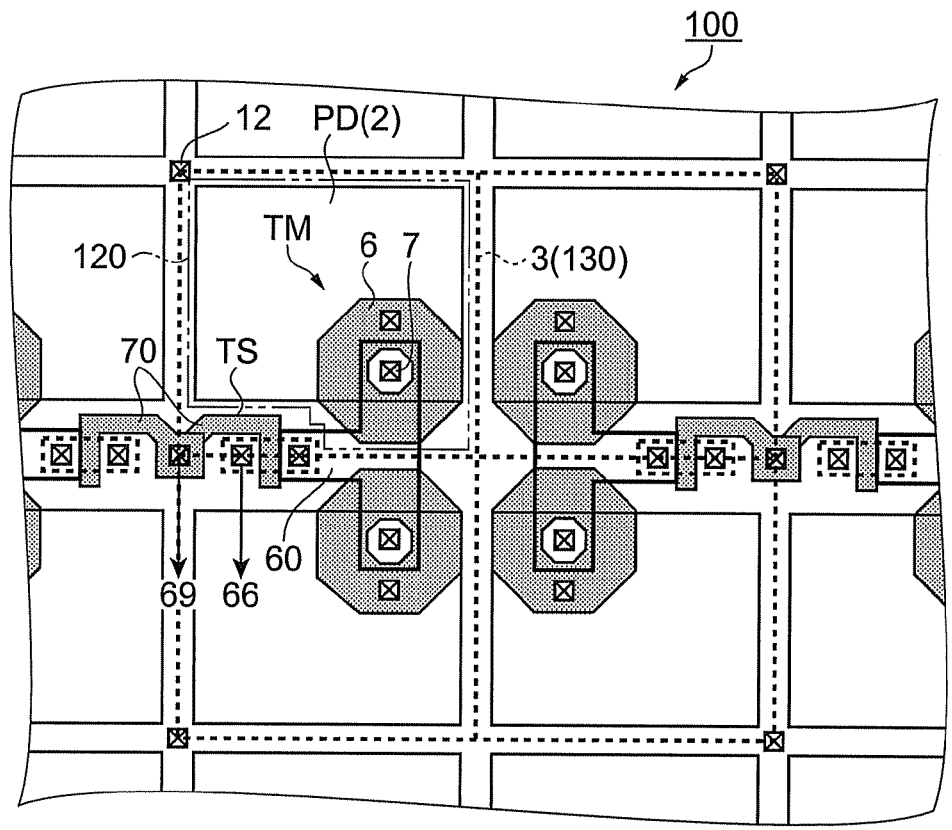
FIG. 7 is an exemplary layout when the VMIS image capturing element is used.

FIG. 7 shows another exemplary layout when a VMIS image capturing element is used. In this layout, the pixels 3 sharing the same source line 66 are laid out by mirror inversion in a direction of intersecting with the source line 66 (orthogonal in this example) on a row basis. Moreover, the pixels 3 sharing the same source line 66 are laid out by mirror inversion located at the positions sandwiching the source line 66 on a row basis. The source sections 7 of the four nearby modulation transistors TM brought closer as a result of mirror conversion are connected together by the metal wiring 60 using a metal including aluminum. The metal wiring 60 as a result of connection and the source line 66 are connected together via the transfer transistor TS. In this layout example, similarly to the layout of FIG. 1A, the placement is enabled with suppression of any area reduction for the aperture section of the photodiode PD.

Moreover, in the transfer transistor TS, four modulation transistors TM are used for contact sharing of the transmission TR gate electrode 70, thereby being able to increase the aperture ratio. Moreover, using this layout enables to place the transmission TR gate line 69 for driving the gate of the transfer transistor TS on a line basis, thereby being able to increase the aperture ratio to a further degree.

Figure 5:
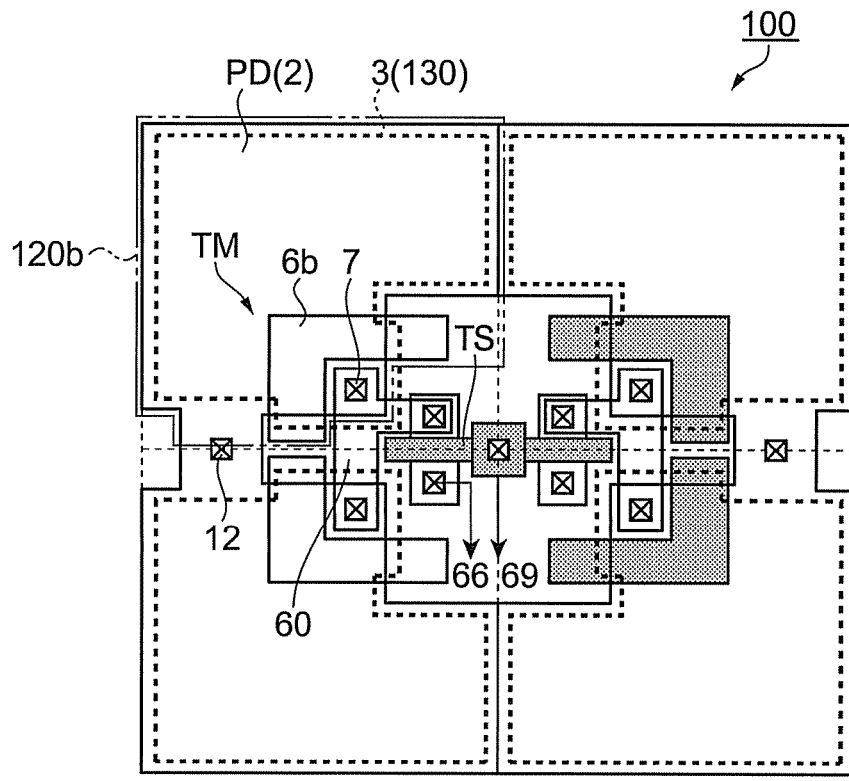
FIG. 5 is an exemplary layout when the substrate-modulation MOS image capturing element is used.

FIG. 5 shows another exemplary layout when a substrate-modulation MOS image capturing element is used. In this layout, not only by laying out the pixels 3 sharing the same source line by mirror inversion on a row basis but also by laying out the pixels 3 located at the positions of sandwiching the source line by mirror inversion on a row basis. The source sections 7 of the four nearby modulation transistors TM brought closer as a result of mirror inversion are connected together by the metal wiring 60 using a metal including aluminum. The metal wiring 60 as a result of connection and the source line 66 are connected together via the transfer transistor TS. This layout example enables, similar to the layout of FIG. 2A, placement with suppression of any area reduction for the aperture section of the photodiode PD.

Moreover, in the transfer transistor TS, four modulation transistors TM are used for contact sharing of the transmission TR gate electrode 70 (refer to FIG. 3), thereby being able to increase the aperture ratio. Moreover, using this layout enables to place the transmission TR gate line 69 for driving the gate of the transfer transistor TS on a line basis, thereby being able to increase the aperture ratio to a further degree.

As such, by referring to FIGS. 1A, 2A, 5, and 7, described above is the layout of implementing a higher aperture ratio by mirror inversion. However, mirror inversion is not an essential process, and alternatively, a layout as a result of general repetition may be used.

<Driving Sequence>

By referring to FIGS. 1B and 3, as the driving sequence, described next is an operation of the photodiode PD of the pixel 3 for light detection and collection of light-generating carriers, and an operation of a modulation transistor TM. First of all, an operation of storing the light-generating carriers is described. Thereafter, described are a signal modulation operation of detecting the amount of the light-generating carriers, and a clearance (ejection of light-generating carriers) operation, and described lastly is a noise modulation operation. Although the description here is given for a case where a VMIS image capturing element is used, using a substrate-modulation MOS image capturing element can be similarly taken care of.

Described first is the operation of storing the light-generating carriers. In this case, a low gate potential is applied to the ring gate electrode 6 of the modulation transistor TM via the gate line 67, and a potential of about 2 to 4V is applied to the drain section 8 via the drain line 68 of shared use. As a result, the PD well section 21 is depleted. Moreover, an electric field is generated between the drain section 8 and the source section 7.

Figure 6:
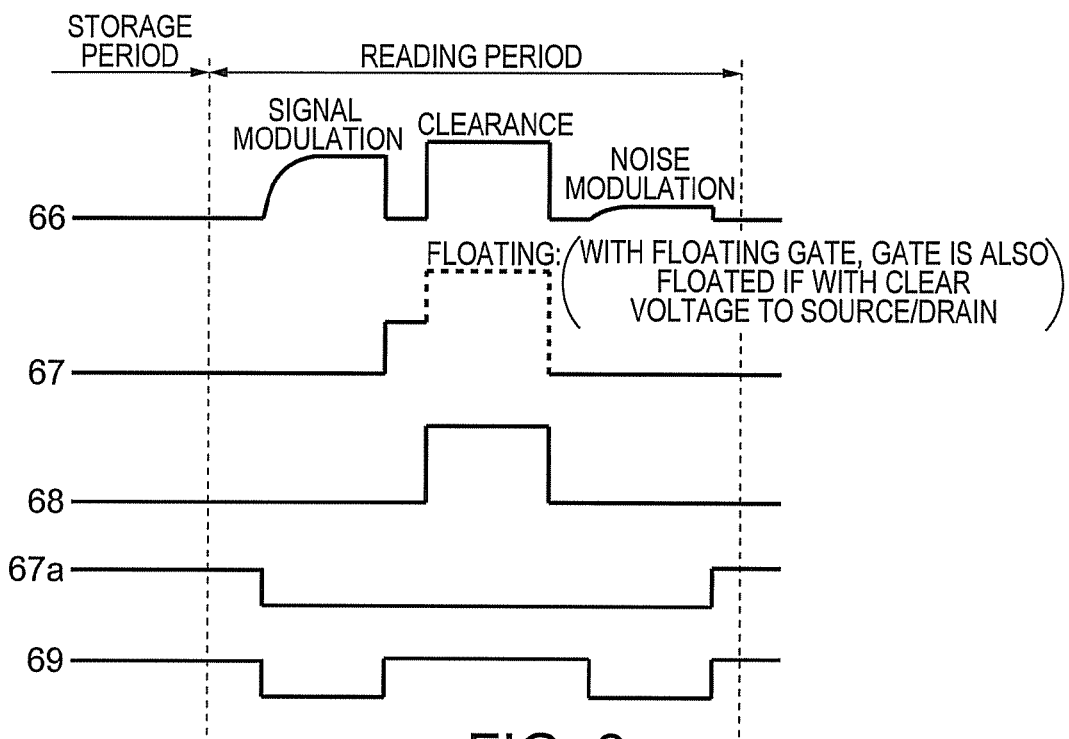
FIG. 6 is an exemplary driving sequence.

When an incoming light via the aperture region 2 of the photodiode PD enters the depleted PD well section 21, a pair of electron—positive hole (light-generating carrier) is generated. Because the P-type collection well section 4 has been reduced in potential due to the induction of P-type impurities of high concentration, and the positive holes in the light-generating carriers generated in the PD well section 21 are collected in the collection well section 4. Moreover, the light-generating carriers are transferred from the collection well section 4 to the modulation well section 5 in the region of the modulation transistor TM, and are then stored in the carrier pocket 10. FIG. 6 shows an exemplary driving sequence. This operation corresponds to the operation in a storage period in the driving sequence of FIG. 6.

Described next is the signal modulation operation for detection of the amount of light carriers. By the light-generating carriers stored in the carrier pocket 10, the modulation transistor TM shows a change of threshold voltage. In this state, the selected gate potential of about 2 to 4V is applied to the ring gate electrode 6 of the selected pixel 3 via the gate line 67, and the potential of about 2 to 4V is applied to the drain section 8. The not-selected pixel 3a is provided with, via the not-selected gate line 67a, the potential lower than the potential to be applied to the ring gate electrode 6 selected by the not-selected ring gate electrode 6a. Thereafter, a selection of the pixels 3 is made by reducing the potential of the not-selected source section 7a that is changed in association with the gate potential to be lower than the potential of the source section 7 of the selected pixel 3, thereby detecting a signal from the pixel 3.

Moreover, between the source section 7 of the selected pixel 3 and the source line 66, the transfer transistor TS of the PMOS configuration is disposed. The transfer transistor TS is provided with a control signal via the transmission TR gate line 69 for enabling conduction/interruption between the source line 66 and the source section 7. When the gate potential of the transfer transistor TS is for signal modulation and noise modulation, the potential is kept low (ON for PMOS configuration), and in the remaining cases, the potential is kept being OFF.

In this case, for the not-selected pixel 3a that is not selected, the gate potential of the not-selected transfer transistor TSa is kept high (OFF for PMOS configuration), and only the potential of the source section 7 of the selected modulation transistor TM is transmitted to the source line 66. Therefore, even when an intense light is directed to the not-selected photodiode PDa, and even when an output signal from the not-selected source section 7a of the not-selected modulation transistor TMa becomes higher than that of the source section 7 of the selected modulation transistor TM after the clearance, the transfer transistor TS can prevent transmission to the source line 66.

This thus enables to stop the occurrence of black smear. The source section 7 of the selected modulation transistor TM is connected to the source line 66 via the transfer transistor TS. To the source line 66, a constant current source (not shown) is disposed for a supply of constant current. With this constant current source and the modulation transistor TM, a source follower circuit is formed. In accordance with any variations of the threshold voltage of the modulation transistor TM as a result of the light-generating carriers, the source potential is changed so that the output potential corresponding to the incoming light can be derived. This operation is corresponding to the signal modulation of the driving sequence of FIG. 6.

Described next is the clearance (ejection of light-generating carriers) operation. With clearance, any light-generating carriers remaining in the carrier pocket 10 and the modulation well section 5 are cleared. The high potential of about 5 to 7V is applied to the ring gate electrode 6 of the modulation transistor TM. The TR well section 50 is thin in thickness, and below the TR well section 50, the P-type embedding layer 23 of high concentration is formed.

Therefore, a sudden potential change occurs to the modulation well section 5, and such an intense electric field as sweeping the light-generated carries to the side of the substrate 1 is mainly applied to the modulation well section 5, and any remaining light-generating carriers are cleared by the substrate 1 without fail by the low reset potential. Note here that as a method of increasing the potential of the ring gate electrode 6, a positive potential is temporarily applied to the ring gate electrode 6 of the modulation transistor TM, and then the ring gate electrode 6 is made to go through a floating operation. The positive potential is then applied to the drain section 8 and/or the source section 7 to make it (those) to execute a boot strap operation of increasing the voltage by capacity coupling so that the clearance can be completed with no direct application of high potential. This operation is corresponding to the clearance of the driving sequence of FIG. 6.

Described next is the noise modulation operation. With the noise modulation, after the clearance, the signal modulation operation is executed in the state that no light-generating carrier is yet stored. The biasing requirements and others are similar to those of the signal modulation operation. This operation is corresponding to the noise modulation of FIG. 6.

With such a noise modulation operation executed, any variations of the threshold value of each of the pixels 3 can be derived as a noise signal. By subtracting the resulting noise modulation signal from the signal modulation signal found by the above-described sequence, a net light-generating carrier signal can be extracted. After the noise modulation operation, the storage operation is executed again, and by repeating such an operation cycle, an image signal is output.

Figure 9:
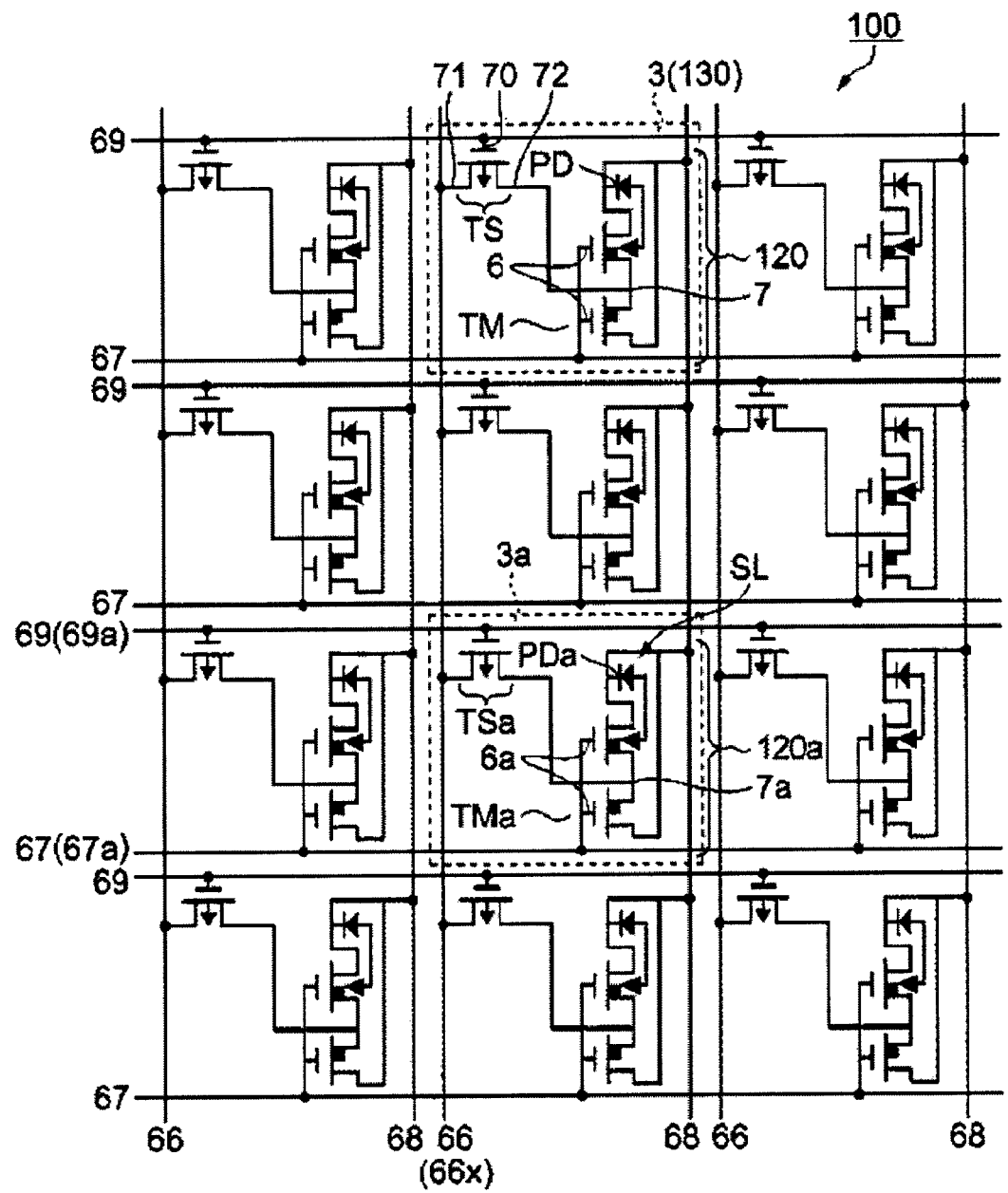
FIG. 9 is an alternative arrangement of the circuit shown in FIG. 3.

Referring now to FIG. 9, each pixel 130 may include a transfer transistor TS. A gate line 69 is associated with each row of pixels and is connected to the gate electrode 70 of the corresponding transfer transistor TS. The source section 71 of the transfer transistor TS is connected to the source line 66 and the drain section 72 is connected to the source sections 7 of the modulation transistors TM. In other words, instead of alternating row of pixels including transfer transistors TS as shown in FIG. 3, pixels in every row may include transfer transistors TS as shown in FIG. 9.

The entire disclosure of Japanese Patent Application Nos: 2007-076105, filed Mar. 23, 2007 and 2007-076106, filed Mar. 23, 2007 are expressly incorporated by reference herein.

What is claimed is:

1. An Image capturing apparatus, comprising:
a first gate line formed in a first direction;
a first source line intersecting with the first gate line, the first gate line and the first source line defining a first pixel;
a common drain line;
a first photodiode formed in the first pixel, the first photodiode being connected to the common drain line;
a first modulation transistor formed in the first pixel, a first drain of the first modulation transistor being connected to the common drain line;
a second gate line formed in the first direction, the second gate line intersecting with the first source line, the second gate line and the first source line defining a second pixel;
a second photodiode formed in the second pixel, the second photodiode being connected to the common drain line;
a second modulation transistor formed in the second pixel, a second drain of the second modulation transistor being connected to the common drain line;
a first line formed in the first pixel and the second pixel, the first line connecting a first source of the first modulation transistor and a second source of the second modulation transistor; and
a transfer transistor formed between the first source line and the first line, the transfer transistor being connected to the first source line, to the first line, and to a third gate line, the third gate line being formed in the first direction and intersecting with the first source line.

2. The image capturing apparatus according to claim 1, the transfer transistor being positioned between the first photodiode and the second photodiode.

3. The image capturing apparatus according to claim 1, the first photodiode having a first aperture section, the first line being formed away from the first aperture section.

4. The image capturing apparatus according to claim 1, a potential of the first source and the second source being configured to be transmitted to the first source line only when selected by the transfer transistor.

5. An Image capturing apparatus, comprising:
a first gate line formed in a first direction;
a first source line intersecting with the first gate line, the first gate line and the first source line defining a first pixel;
a common drain line;
a first photodiode formed in the first pixel, the first photodiode being connected to the common drain line;
a first modulation transistor formed in the first pixel, a first drain of the first modulation transistor being connected to the common drain line;
a second gate line formed in the first direction, the second gate line intersecting with the first source line, the second gate line and the first source line defining a second pixel;
a second photodiode formed in the second pixel, the second photodiode being connected to the common drain line;
a second modulation transistor formed in the second pixel, a second drain of the second modulation transistor being connected to the common drain line;
a first transfer transistor formed in the first pixel, the first transfer transistor being connected to a first source of the first modulation transistor, to a third gate line, and to the first source line; and
a second transfer transistor formed in the second pixel, the second transfer transistor being connected to a second source of the second modulation transistor, to a fourth gate line, and to the first source line.

* * * * *